United States Patent [19]

Koepke et al.

[11] 4,256,792

[45] Mar. 17, 1981

[54] COMPOSITE ELECTRONIC SUBSTRATE OF ALUMINA UNIFORMLY NEEDLED THROUGH WITH ALUMINUM NITRIDE

[75] Inventors: Barry G. Koepke, Mound; Kelly D. McHenry, Eden Praire, both of Minn.

[73] Assignee: Honeywell Inc., Minneapolis, Minn.

[21] Appl. No.: 115,525

[22] Filed: Jan. 25, 1980

[51] Int. Cl.³ .................. B32B 5/08; B32B 19/00; C04B 33/14; C04B 35/58; H01L 23/36

[52] U.S. Cl. .................................. 428/119; 264/24; 264/61; 264/63; 264/86; 264/175; 357/81

[58] Field of Search .................. 357/81; 428/119; 264/24, 61, 63, 86, 175

[56] References Cited

U.S. PATENT DOCUMENTS

| | | | |
|---|---|---|---|
| 3,118,789 | 1/1964 | Wiswell et al. | 428/119 |
| 3,296,501 | 1/1967 | Moore | 357/81 |
| 3,399,332 | 8/1968 | Savalainen | 357/81 |
| 3,723,176 | 3/1973 | Theobald et al. | 264/61 |
| 3,735,485 | 5/1973 | Wilson | 29/591 |
| 3,829,356 | 8/1974 | Rutt | 428/119 |
| 3,969,754 | 7/1976 | Kuniya et al. | 357/81 |
| 4,069,498 | 1/1978 | Joshi | 357/81 |
| 4,170,677 | 10/1979 | Hutcheson | 428/119 |
| 4,199,637 | 4/1980 | Sado | 428/374 |

*Primary Examiner*—James C. Cannon
*Attorney, Agent, or Firm*—Omund R. Dahle

[57] ABSTRACT

An aluminum oxide-aluminum nitride composite electronic substrate with anisotropic thermal properties is described. The aluminum nitride is in the form of needles incorporated into the aluminum oxide, the needles being oriented or aligned through the thickness of the substrate parallel to the short transverse direction of the substrate. The substrate has improved thermal conductivity in the short transverse direction and yet maintains good dielectric strength across the surface of the substrate. The improved thermal conductivity is required for heat dissipation from the micropackage assembly.

3 Claims, 2 Drawing Figures

COMPOSITE ELECTRONIC SUBSTRATE OF ALUMINA UNIFORMLY NEEDLED THROUGH WITH ALUMINUM NITRIDE

BACKGROUND AND SUMMARY OF THE INVENTION

The present invention relates generally to the field of substrates for microcircuits and more directly to a ceramic composite substrate consisting of an aluminum oxide ($Al_2O_3$) matrix containing electrically non-conductive, thermally conductive needles of aluminum nitride (AlN) uniformly distributed in the substrate in a geometry that allows for improving the heat dissipating abilities of the substrate. The methods for removal of heat from semiconductor devices whether discrete components, integrated circuits or microcircuits, are numerous. Examples of sundry methods are shown in U.S. Pat. Nos. 4,106,188; 4,069,498; 4,024,570; 3,969,754; 3,735,485; 3,723,176; 2,982,892; 2,967,984; 2,857,560; and 2,758,261.

In the present invention it is necessary to provide an electrically non-conductive substrate for a micropackage assembly having anisotropic thermal properties. That is, the substrate has improved thermal conductivity in the short transverse direction as is required for heat dissipation from the micropackage assembly and yet maintains good dielectric strength across the surface of the substrate.

DESCRIPTION

Figure 1:
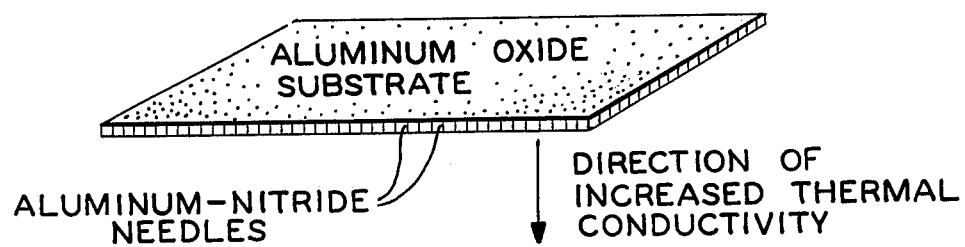
FIG. 1 of the drawing is a diagrammatic representation of an embodiment of the invention; and, FIG. 1a is an enlargement of a portion of FIG. 1.
Figure 1A:
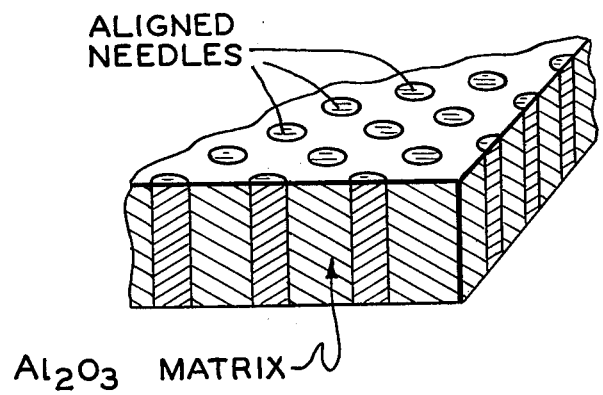

The figures of the drawing show a pictorial type view of the basic aluminum oxide ($Al_2O_3O$) substrate which contains aluminum nitride needles uniformly distributed such that their orientation is predominantly along the direction parallel to the short transverse direction of the substrate. The base material or matrix of the substrate is preferably aluminum oxide although other suitable dielectric substrate materials may be used. Aluminum oxide, which is intended for use in micropackage assembly, has excellent dielectric and mechanical strength properties but is somewhat limited in thermal conductivity. An improved anisotropic thermal conductivity in the short transverse direction which increases the suitability of the substrate for heat dissipation from the attached micropackage assembly, is provided by the higher thermal conductivity resulting from incorporation of needles of aluminum nitride which is also a dielectric. These dielectric, high thermal conductivity needles of AlN incorporated into the $Al_2O_3$ matrix are preferentially aligned parallel to the short transverse dimension of the substrate. The AlN needles as a result of their high thermal conductivity, then serve as solid state heat pipes to dissipate heat away from the microcircuitry during operation thereby providing the desired anisotropic thermal conductivity of the substrate.

In a preferred method of preparing the composite substrate a slurry of aluminum oxide powder with necessary solvents, plasticisers and binders is first mixed, and the aluminum nitride needles are then added. The slurry is poured onto a moving sheet in the usual manner of a ceramic tape casting operation to form substrate material which may be about 0.025" thick. The needles of aluminum nitride are uniformly distributed throughout the bulk of the substrate before drying and the concentration of aluminum nitride may be from a few percent up to about 50 volume percent of the total without having adjacent needles in contact with each other in the finished substrate. In an important step of the invention an electric field is applied to align or orient the AlN needles parallel to the short transverse dimension of the substrate while still in the slurry state and while the solvents are being evaporated. As a result of the application of the electric field the aluminum nitride needles are aligned through the thickness of the substrate so that the substrate has anisotropic thermal properties, wherein the needles serve as solid state heat pipes to dissipate heat away from the microcircuitry. Following drying the substrate is fired to eliminate the remaining organic materials and to sinter the composite ceramic substrate to good density.

The embodiments of the invention in which an exclusive property or right is claimed are defined as follows:

1. A composite dielectric ceramic substrate structure for use in micropackage assembly and having anisotropic thermal properties comprising a matrix of aluminum oxide ($Al_2O_3$) containing aluminum nitride (AlN) needle-like elements distributed throughout the substrate, the AlN elements having a higher thermal conductivity than the $Al_2O_3$, the AlN needles being aligned parallel to the short transverse dimension of the substrate to thereby serve as solid state heat pipes through the substrate and provide anisotropic thermal properties in the substrate.

2. A composite dielectric substrate comprising:
    a plurality of aluminum nitride (AlN) needle like particles having a high thermal conductivity compared to aluminum oxide;
    a sheet like substrate of aluminum oxide, said plurality of needle-like aluminum nitride particles being dispersed in said sheet like substrate and each needle like particle being aligned through the thickness of the substrate parallel to its short transverse direction;
    whereby the higher thermal conductivity of the transversely aligned aluminum nitride needles act as solid state heat pipes through the thickness of the substrate and provide anisotropic thermal properties in the substrate.

3. A process for fabricating an $Al_2O_3$—AlN composite electronic substrate with anisotropic thermal properties comprising the steps of:
    providing a slurry of aluminum oxide powder, solvent, platiciser and binder;
    providing a quantity of needles of aluminum nitride, said aluminum nitride having a high thermal conductivity compared to the aluminum oxide, and adding the aluminum nitride needles to said slurry;
    tape casting said slurry onto an organic carrier film;
    heating and drying said tape cast slurry;
    applying an electric field to said tape cast slurry while heating and drying to orient and align said aluminum nitride needles through the thickness of the tape parallel to its short transverse direction;
    selecting substrates from the tape casting; and
    firing the substrates to eliminate the organic materials and to form a sintered ceramic composite consisting of an aluminum oxide matrix containing aluminum nitride needles aligned parallel to the short transverse dimension of the ceramic.

* * * * *